(12) United States Patent  
Caradonna et al.

(10) Patent No.: US 9,063,170 B2
(45) Date of Patent: Jun. 23, 2015

(54) INTERFACE FOR A TEST SYSTEM

(71) Applicant: Teradyne, Inc., North Reading, MA (US)

(72) Inventors: Michael Caradonna, Santa Clara, CA (US); Jacob Fern, Goleta, CA (US); Stephen Wilkinson, Gilroy, CA (US)

(73) Assignee: Teradyne, Inc., North Reading, MA (US)

( * ) Notice: Subject to any disclaimer, the term of this patent is extended or adjusted under 35 U.S.C. 154(b) by 333 days.

(21) Appl. No.: 13/728,045

(22) Filed: Dec. 27, 2012

(65) Prior Publication Data

US 2014/0184257 A1 Jul. 3, 2014

(51) Int. Cl.
*G01R 1/04* (2006.01)
*G01R 31/28* (2006.01)

(52) U.S. Cl.
CPC .......... *G01R 1/0408* (2013.01); *G01R 31/2889* (2013.01)

(58) Field of Classification Search
CPC .................. G01R 1/0408; G01R 31/2889
USPC ................................... 324/750.24
See application file for complete search history.

(56) References Cited

U.S. PATENT DOCUMENTS

| | | |
|---|---|---|
| 6,512,389 B1 | 1/2003 | Kocher |
| 2004/0257097 A1 | 12/2004 | Beaucag et al. |
| 2010/0134134 A1* | 6/2010 | Grover et al. ................. 324/763 |
| 2012/0146682 A1 | 6/2012 | Gluschenkov et al. |
| 2012/0187972 A1 | 7/2012 | Lee |
| 2012/0208381 A1 | 8/2012 | Garcia et al. |

OTHER PUBLICATIONS

International Search Report and Written Opinion mailed Jan. 20, 2014 in international application No. PCT/US2013/062843, 10 pgs.

* cited by examiner

*Primary Examiner* — Thomas F Valone
(74) *Attorney, Agent, or Firm* — Fish & Richardson P.C.

(57) ABSTRACT

An example test system includes: a pin electronics board for exchanging signals with a device under test (DUT), where the pin electronics board includes first electrical contacts; an interposer between the pin electronics board and a paddle board, where the paddle board includes second electrical contacts, and where the interposer includes electrical connectors for use in establishing electrical pathways between the first electrical contacts and the second electrical contacts; and an actuator configured to force the paddle board and the interposer to make contact so as to cause the electrical connectors to contact the second electrical contacts and thereby establish the electrical pathways.

21 Claims, 17 Drawing Sheets

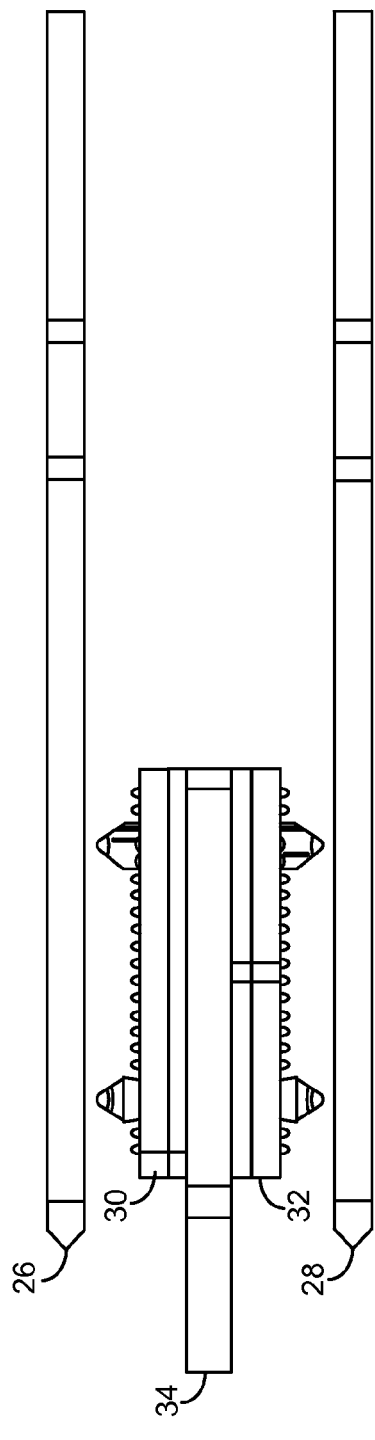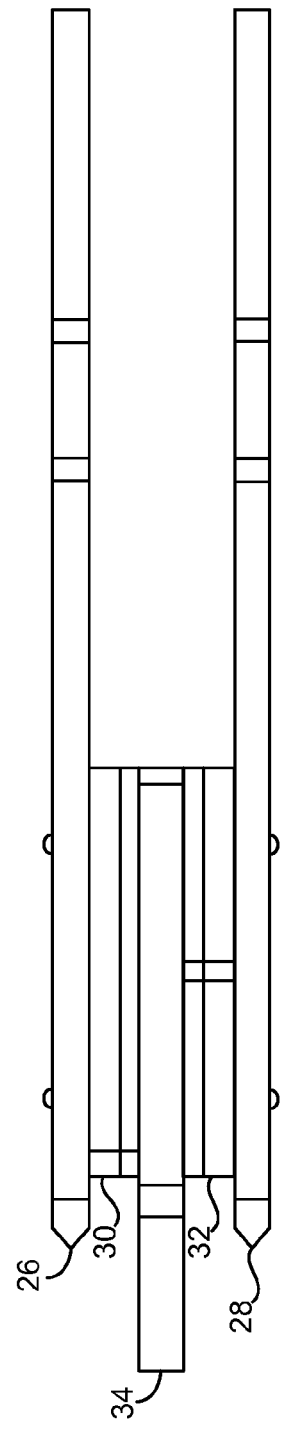

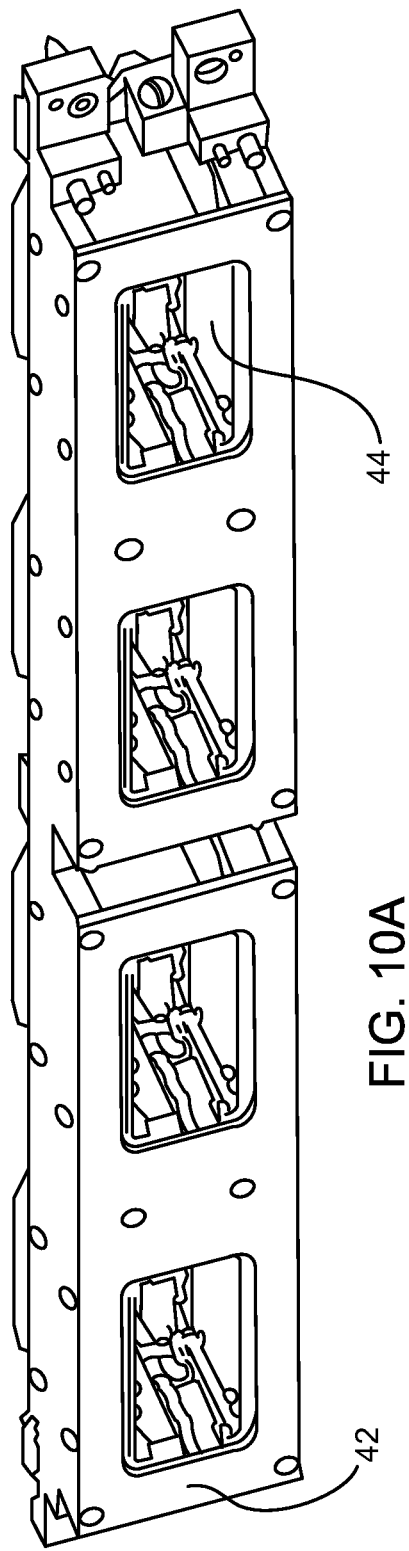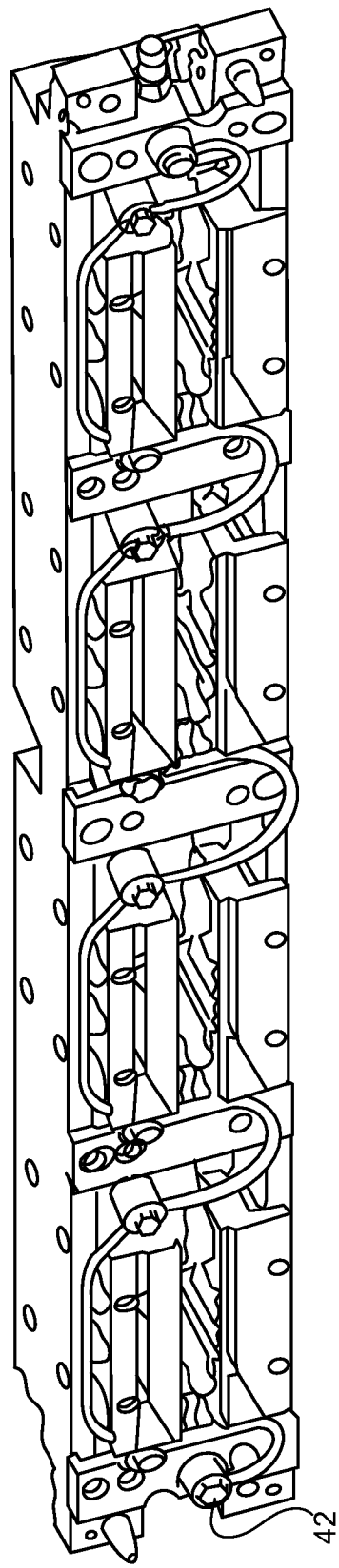
FIG. 10A
FIG. 10B

INTERFACE FOR A TEST SYSTEM

TECHNICAL FIELD

This patent application relates generally to an interface for a test system.

BACKGROUND

Automatic test equipment (ATE), which is often referred to as a "tester", includes electronics for testing a device under test ("DUT"). One component of a tester is its interface. The interface brings-out instrument signals to a customer test fixture for a device to be tested. A challenge is to bring-out a number of signals having appropriate electrical signal fidelity at an appropriate cost.

Prior generation testers include an internal cable assembly to bring-out signals from an internal instrument card to a standard tester interface (to which a DUT connects). This is done for several reasons. For example, the cable interface provides a standard interface for customer applications, test fixtures, and calibration. The cable interface also helps address potential alignment issues between the instrument and a customer DUT board. The cable interface is also useful in addressing space transformation issues between the instrument pitch and the customer test fixture. Despite these attributes, there are some issues associated with use of a test head interface that uses only cables. For example, the cable interface can add impedance discontinuities at the coaxial cable terminations, which can impact signal fidelity. The cable length itself can also result in additional signal attenuation. Also, the cost of internal signal cables can be relatively high.

SUMMARY

An example test system may include one or more of the following features: a pin electronics (PE) board for exchanging signals with a device under test (DUT), where the pin electronics board includes first electrical contacts; an interposer between the pin electronics board and a paddle board, where the paddle board includes second electrical contacts, and where the interposer includes electrical connectors for use in establishing electrical pathways between the first electrical contacts and the second electrical contacts; and an actuator configured to force the paddle board and the interposer to make contact so as to cause the electrical connectors to contact the second electrical contacts and thereby establish the electrical pathways. The example test system may include one or more of the following features, either alone or in combination.

The interposer may be a first interposer; the paddle board may be a first paddle board; the first electrical contacts may be on a first side of the pin electronics board; the electrical connectors may be first electrical connectors; and the pin electronics board may include third contacts on a second side of the pin electronics board. The example test system may include the following features: a second interposer between the second side of the pin electronics board and a second paddle board, where the second paddle board includes fourth electrical contacts, and where the second interposer includes second electrical connectors for use in establishing second electrical pathways between the third electrical contacts and the fourth electrical contacts. The actuator may be configured also to cause the second paddle board and the second interposer to make contact so as to cause the second electrical connectors to contact the fourth electrical contacts and thereby establish the second electrical pathways.

The example test system may include one or more springs biased to cause connection of the paddle board and the interposer absent force applied by the actuator. The actuator may include a pneumatic system that includes one or more pistons that are controllable to compress one or more corresponding springs.

The example test system may include a field replaceable unit (FRU) that includes the actuator. The FRU may be installed in one of a plurality of slots of the PE board. The alignment features may include coarse alignment features that include alignment guides. The alignment features may include fine alignment features, which may include pins that corresponds to holes in the paddle board.

The FRU may include multiple insertion slots. Each of the multiple insertion slots may accommodate two paddle boards. The two paddle boards may be arranged with the pin electronics board therebetween. Each of the multiple insertion slots may be configured to receive two paddle boards using substantially zero insertion force.

The actuator may include a screw or a cam and the electrical connectors may be pogo pins. In some cases, there need be no cable connections between the pin electronics board and the paddle board. The actuator may include at least one of a motor, a piezoelectric material, an electromagnet, or pneumatics.

An example test system may include one or more of the following features: a field replaceable unit (FRU) that includes multiple insertion slots, where each of the multiple insertion slots is for accommodating a pair of paddle boards, and where each of the paddle boards is configured with electrical pathways to route signals between the test system and one or more devices under test (DUTs). At least one insertion slot of the multiple insertion slots may include: a pin electronics (PE) board for exchanging signals with a DUT, where the pin electronics board includes first electrical contacts on a first side thereof and second electrical contacts on a second side thereof; a first interposer between the first side of the pin electronics board and a first paddle board of the pair of paddle boards, where the first paddle board includes third electrical contacts, and where the first interposer includes first electrical connectors for use in establishing first electrical pathways between the first electrical contacts and the third electrical contacts; a second interposer between the second side of the pin electronics board and a second paddle board of the pair of paddle boards, where the second paddle board includes fourth electrical contacts, and where the second interposer includes second electrical connectors for use in establishing second electrical pathways between the second electrical contacts and the fourth electrical contacts; and one or more actuators configured to apply force to the first and second paddle boards to so as to cause the first and second electrical connectors to contact the third and fourth electrical contacts, respectively, and thereby establish the first and second electrical pathways. The example test system may include one or more of the following features, either alone or in combination.

Each of the multiple insertion slots may include a pin electronics board, a first interposer, a second interposer, and one or more actuators. At least one insertion slot may include one or more springs biased to inhibit connection of the first paddle board to the first interposer and the second paddle board to the second interposer absent force applied by the actuator.

The at least one insertion slot may include alignment features for aligning each paddle board within the at least one insertion slot. The alignment features may include coarse alignment features that include alignment guides. Each of the first interposer and the second interposer may include fine alignment features. The fine alignment features may include pins that correspond to holes in a corresponding paddle board.

The actuator may include a pneumatic system that includes one or more pistons that are controllable to compress one or more corresponding springs. On each interposer, each signal contact may be associated with two ground pins to form a ground-signal-ground (GSG) triplet. The at least one insertion slot may be configured to receive two paddle boards using substantially zero insertion force. The actuator may include a screw or a cam and the electrical connectors may be pogo pins. In some cases, there need be no cable connections between the pin electronics board and either the first paddle board or the second paddle board.

Any two or more of the features described herein, including in this summary section, may be combined to form embodiments not specifically described herein.

Parts of the foregoing may be implemented as a computer program product comprised of instructions that are stored on one or more non-transitory machine-readable storage media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DESCRIPTION OF THE DRAWINGS

FIG. 3 is a top view of an example interposer.

FIG. 6 is a side view of an example zero insertion force (ZIF) connection in an open configuration, where the ZIF connection is comprised of a PE board, interposers at the top and bottom of the PE board, and paddle boards for mating to respective interposers.

FIGS. 7 and 8 are side views of example ZIF connections in a closed configuration, where the ZIF connection is comprised of a PE board, interposers at the top and bottom of the PE board, and paddle boards mating to respective interposers.

FIGS. 10A and 10B are perspective views of a front and back an example actuator assembly that holds multiple slots for ZIF interfaces.

DETAILED DESCRIPTION

Figure 1:
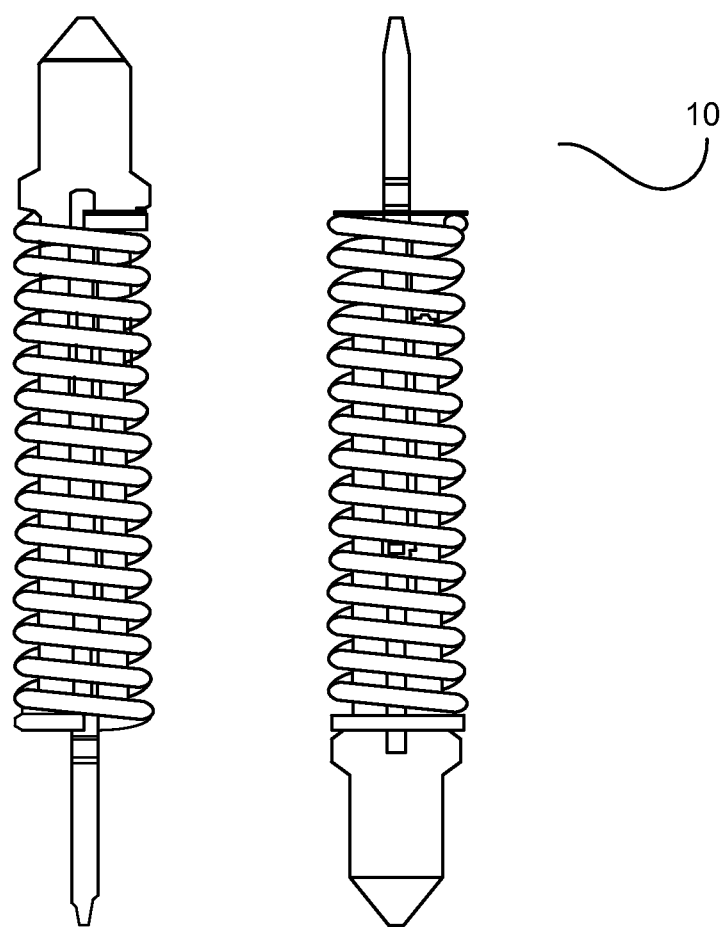
FIG. 1 shows two side views of an example connector (in two different orientations) for use in an interposer.

Device manufacturers, such as memory manufacturers and other semiconductor manufacturers, generally test devices at various stages of production. During manufacturing, integrated circuits may be fabricated in large quantities on a single silicon wafer. Each wafer may be cut into individual integrated circuits called dies. Each die may be loaded into a frame, and bonding wires may be attached to connect the die to leads that extend from the frame. The loaded frame may be encapsulated in plastic or another packaging material to produce a finished product. Manufacturers have an economic incentive to detect and discard faulty components as early as possible in the manufacturing process. Accordingly, many manufacturers test integrated circuits at the wafer level, before a wafer is cut into dies. Defective circuits are marked and generally discarded prior to packaging, thus saving the cost of packaging defective dies. As a final check, many manufacturers test each finished product before it is shipped.

To test quantities of components, manufacturers commonly use testers. In response to machine-executable instructions in a test program, a tester automatically generates input signals to be applied to an integrated circuit, and monitors output signals. The tester compares the output signals with expected responses to determine whether the device under test, or "DUT," is defective. Signal processing and transmission is typically performed using pin electronics.

Customarily, component testers are designed in two different portions. A first portion, called a "test head" includes circuitry that may be located close to the DUT, for example, driving circuitry, receiving circuitry, and other circuitry for which short electrical paths are beneficial. A second portion, called a "tester body," is connected to the test head via cables, and contains electronics that may not be close to the DUT. In some implementations, special machines move and mechanically and electrically connect devices to a tester in succession. A "prober" is used to move devices at the semiconductor wafer level. A "handler" is used to move devices at the packaged device level. Probers, handlers, and other devices for positioning a DUT relative to a tester are generically known as "peripherals." Peripherals generally are at a site where DUTs are positioned for testing. A peripheral feeds a DUT to the test site, the tester tests the DUT, and the peripheral moves the DUT away from the test site, so that another DUT can be tested.

The test head and peripheral may be separate pieces of machinery that generally have separate support structures. Therefore, in some implementations, before testing begins, the test head and the peripheral may be attached together. In general, this is accomplished by moving the test head toward the peripheral, aligning the test head, and latching the test head to the peripheral. Once latched, a docking mechanism pulls the test head and peripheral together, causing spring-loaded contacts between the test head and peripheral to compress and form electrical connections between the tester and the DUT.

The tester includes an interface to a customer fixture, which may be an intermediary interface to the DUT. In some examples, the interface includes a zero insertion force (ZIF) interface of the type described below. In this context, ZIF refers to an interface that can be opened and closed in any appropriate manner. When opened, a mating connector may be inserted therein without pressure or, in some cases, with reduced pressure. The interface is then closed, causing an electrical and mechanical connection to be made with the mating connector. Although the following description focuses on a ZIF interface, the test systems described herein are not limited to use with a ZIF interface, and may be used with a non-ZIF interface as well. In both cases, however, the number of cables (e.g., coaxial cables and/or other wiring) used to route signals through the interface is reduced, in some examples to zero or to single digits.

As described below, the example ZIF interface described herein uses interposer boards (or simply "interposers") to make electrical and mechanical connections between pin electronics (PE) boards on the tester and paddle boards (also referred to simply as "paddles") that contain electrical contacts and wires connected thereto. In some examples, an interposer connects to the top and bottom of a PE board and a corresponding paddle board connects to each interposer. The connection closes by pushing the paddle boards into contact with their respective interposers, thereby establishing electrical pathways between the PE board and the paddle boards. Signals travel between the PE board and the paddle boards via the electrical pathways established by the interposers. The connection is broken by forcing the paddle board away from the interposers. Various feature of configurations, such as this, are described in more detail below.

More specifically, in the case of a ZIF interface, an appropriate interposer is used to provide a combination of adequate contact travel, cycle life, contact density, and reliability. In some examples, the interposer is a circuit board containing connectors that provide electrical connection between the circuit board of a customer and pin electronics (PE) on the tester. In some example implementations, the interposer board is a stamped contact array connector (SCA). This connector typically provides a dense compliant electrical interface that is robust enough to endure the cycles required of a ZIF interface.

The basic building block of the SCA interposer is the connector (or "contact"). In this example, to meet a density requirement, a vertical contact is used (although non-vertical contacts may be used in other implementations). A pogo pin is an example of a vertical contact, although other types of vertical contacts may be used.

Figure 2:
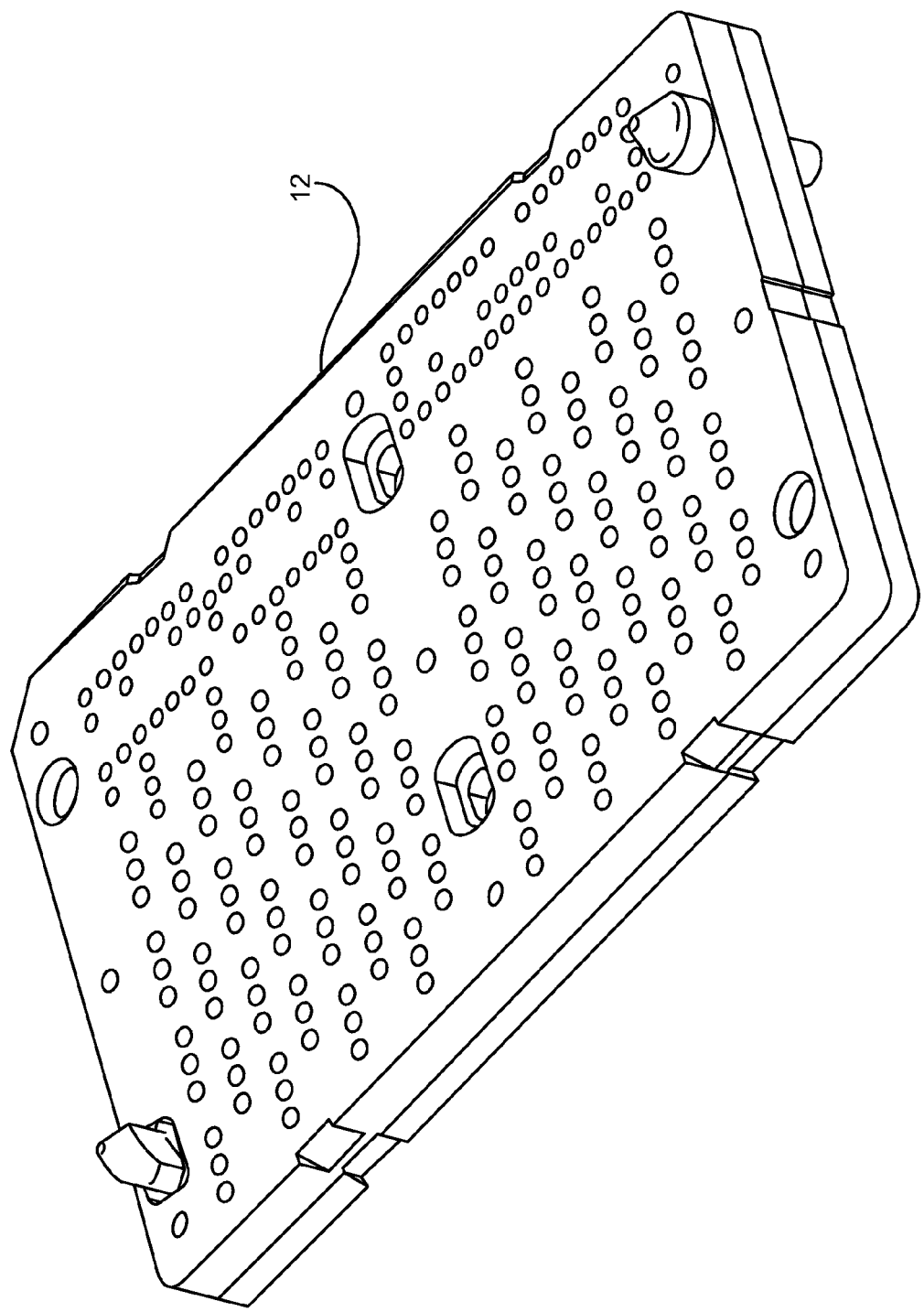
FIGS. 2 and 3 are perspective views of an example interposer.

An example pogo pin, e.g., H-pin 10 of FIG. 1, may be used for processor and burn-in test sockets. An example SCA interposer 12, which contains such H-pins, is shown in FIG. 2. The example SCA interposer 12 is configured to hold one or more arrays of H-pins 10. Although the interposer described herein uses H-pins, any type of interposer may be used in its place. The interface described herein may be used with any appropriate type of interposer, and is not limited to the examples described here.

Figure 3:
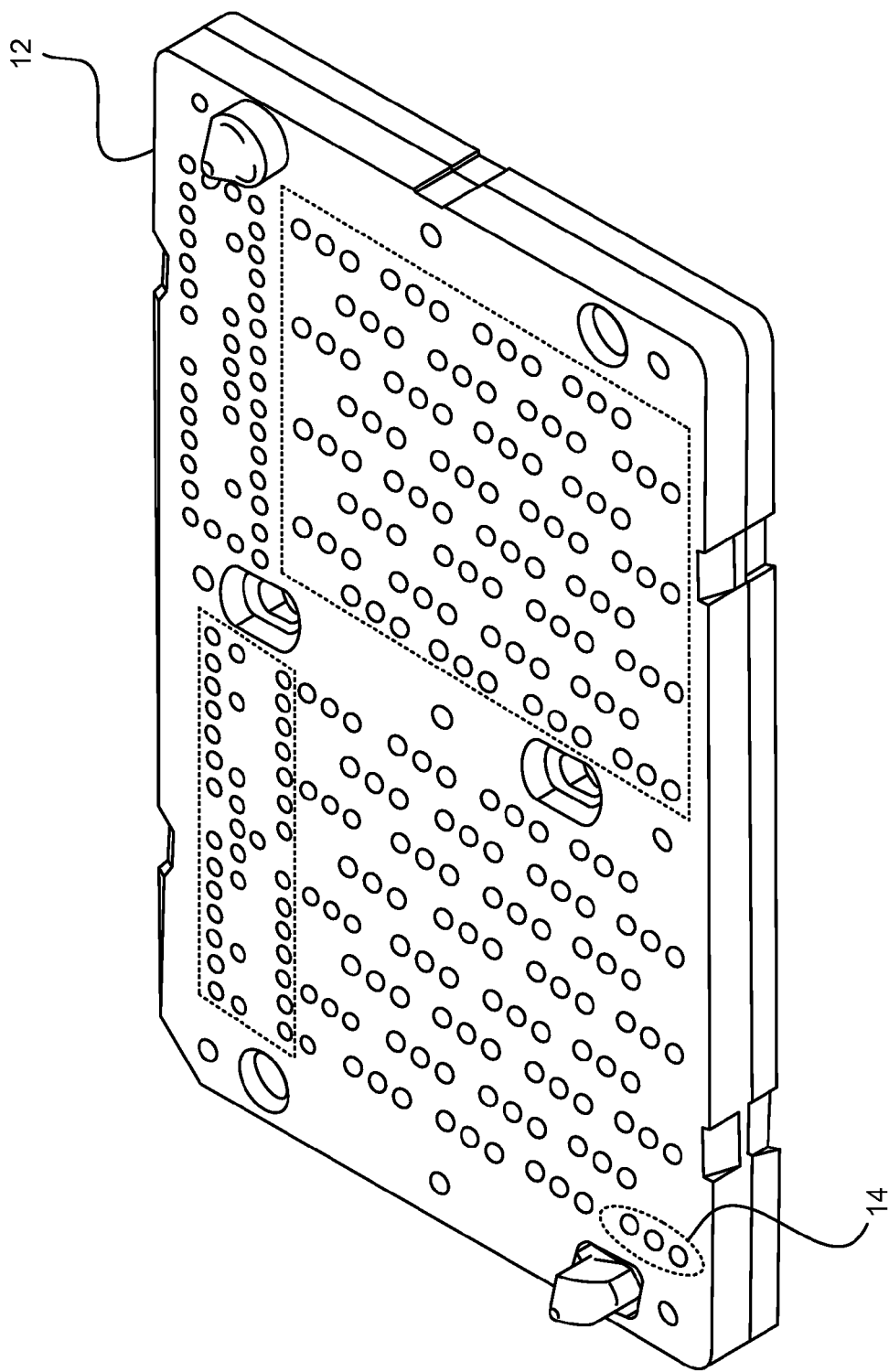
Figure 4:
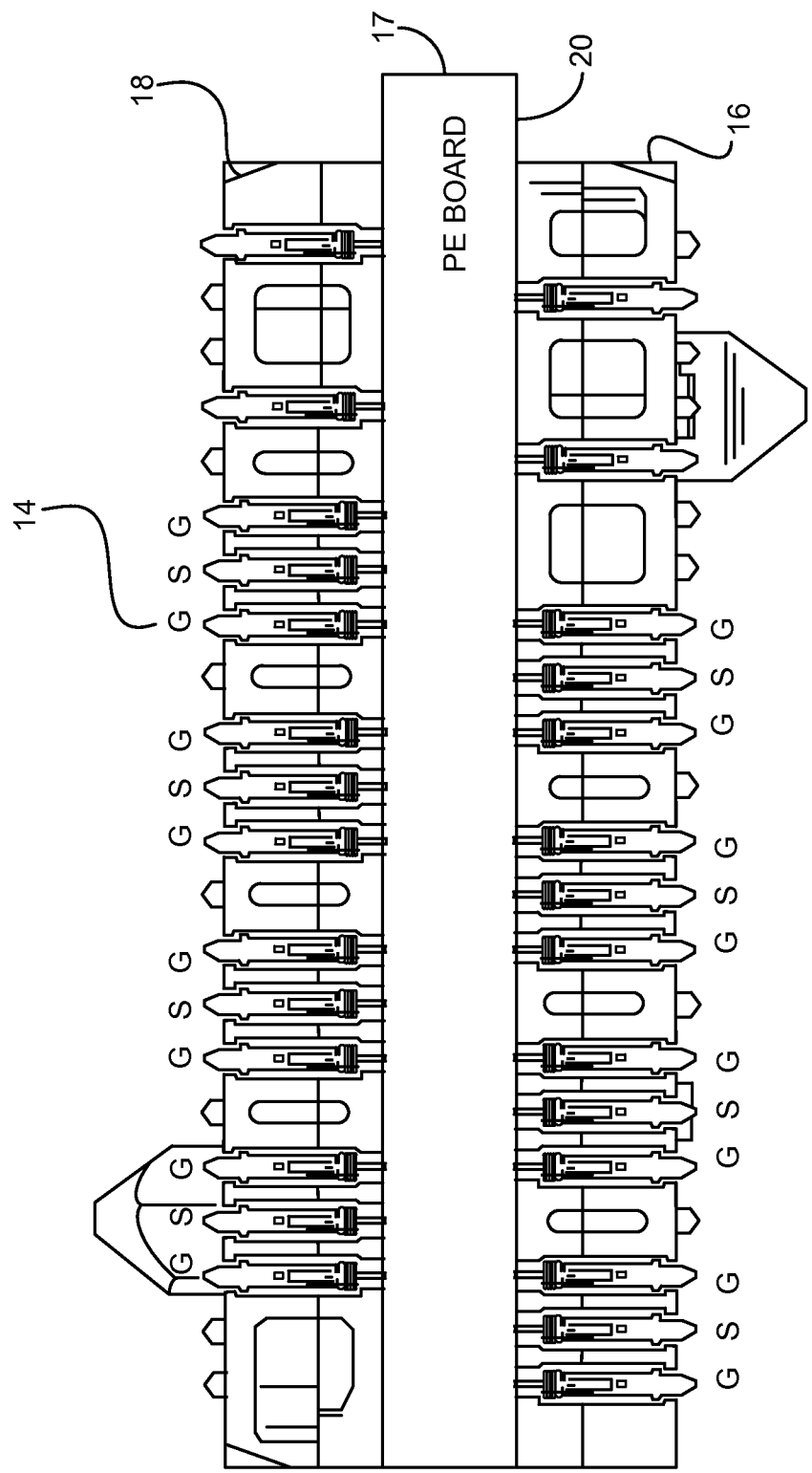
FIG. 4 is a side view showing an example interconnection of a pin electronics (PE) board and interposers above and below the PE board.

In some examples, SCA interposer 12 has a specific pattern of pins in order to meet routing, density, and performance requirements of the tester and/or DUT. The pattern may also be chosen to allow the same SCA interposer connector to be connected to both sides (e.g., top and bottom) of a PE board, thereby increasing interface signal density. In some examples, each high-speed signal pin on the SCA interposer may be surrounded by two ground H-pins forming a ground-signal-ground (GSG) triplet. These triplets 14 are shown in FIGS. 3 and 4. FIG. 4, in particular, shows an example PE board 17, with interposers 16 and 18 connected to the top and bottom thereof, and with example H-pins on the interposers. Triplets 14 may be arranged such that a connector on the bottom side 20 of PE board 17 shares the same ground, although this is not a requirement.

In order to reduce cross-talk between connections, H-pins may be arranged on one side of the PE board (e.g., the top) relative to H-pins on the other side of the PE board (e.g., the bottom) to lessen their electrical interaction. For example, there may be no, or little, overlap of the H-pins on the different sides. In this regard, H-pin density in the high speed region of the SCA interposer may be driven by the cross-talk concerns rather than pin size. To further reduce cross-talk, high speed signal vias may be back-drilled on the PE side that does not have an H-pin pad. The pads on the PE board may be plated with hard gold in order to reduce damage to the pad from repeated connector cycling, as this can become a concern with high cycle counts.

Figure 5:
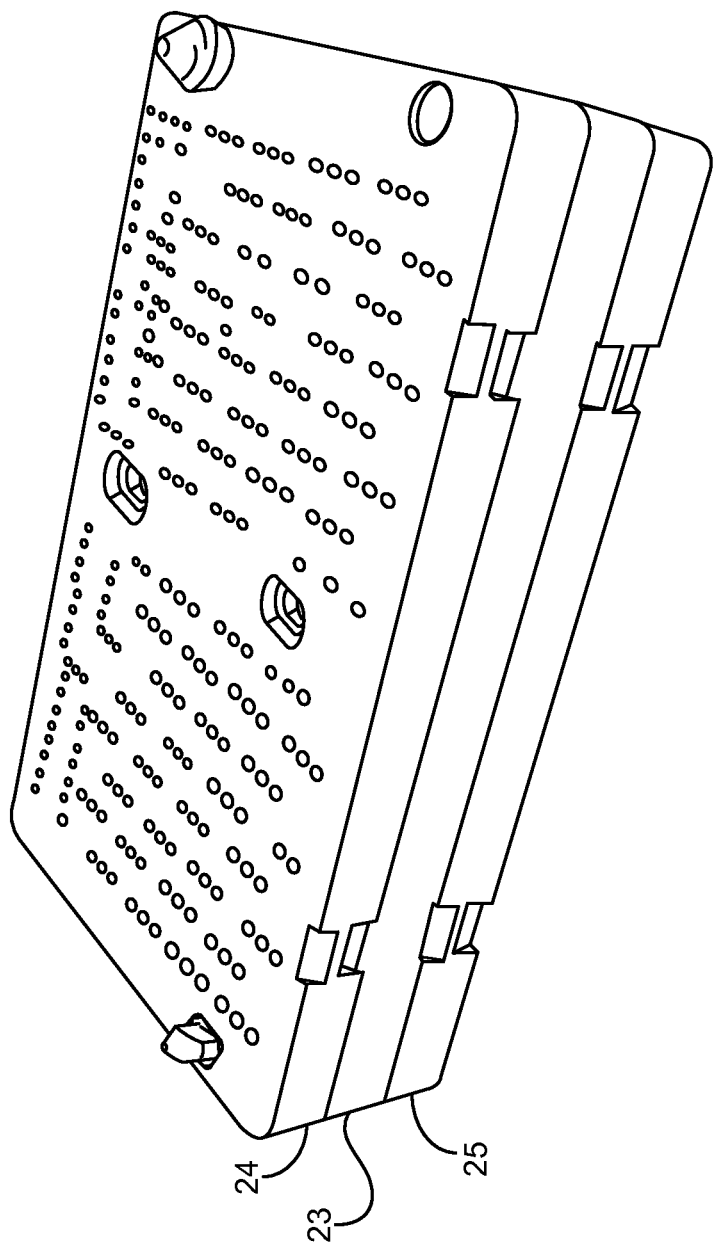
FIG. 5 is a perspective view of example interposers connected to the top and bottom of a PE board.

An example of SCA interposers 24 and 25 installed on a top and bottom of PE board 23 is shown in FIG. 5.

Another part of the example ZIF interface is the paddle board, which is mentioned above. The paddle board is a customer/DUT board configured with cable contacts to customer/DUT circuitry. In some examples, the paddle board mates with the SCA interposer on the PE board and is used to launch the interface electrical signals into coaxial (or other) cables. To this end, the paddle board includes electrical contacts, which receive electrical signals from the PE via the SCA interposer connectors (e.g., the H-pins). The electrical contacts on the paddle board are electrically connected to circuits that themselves are electrically connected to coaxial (or other) cables that go to a customer fixture. The paddle board is not typically part of the test head, although it may be in some implementations. Instead, it is typically part of a customer fixture.

In addition to launching the signals into cable, the paddle board has alignment features that provide coarse alignment between the PE board and the customer Tester Interface Unit (TIU), and fine alignment features between pads on the paddle board and each SCA interposer.

Figure 8:
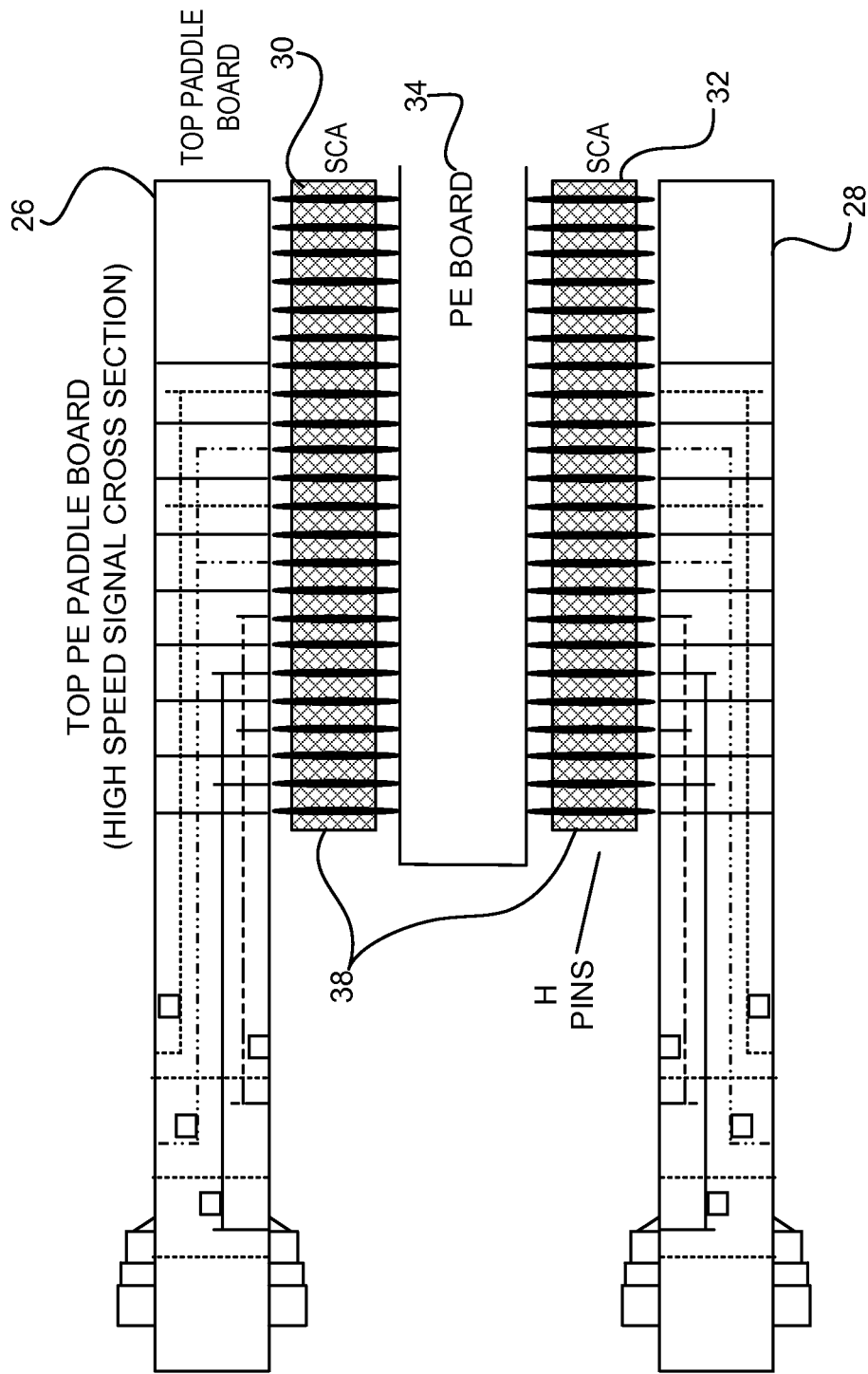

FIG. 6 shows paddle boards 26, 28 in the ZIF open position and FIG. 7 shows paddle boards 26, 28 in the ZIF closed position with respect to SCA interposers 30, 32 and PE board 34. In some examples, each paddle board is configured to provide a high performance signal path between an SCA interposer H-pin pads and coaxial cables. In some implementations, the high speed paths use stripline construction and back drilled vias to reduce cross talk and to control impedance. A cross-section of paddle board routing is shown in FIG. 8. That is, FIG. 8 shows paddle boards 26, 28, respective SCA interposers 30, 32, and H-pins 38 between each paddle board/SCA interposer pair connecting to wiring on PE board 34.

Figure 9:
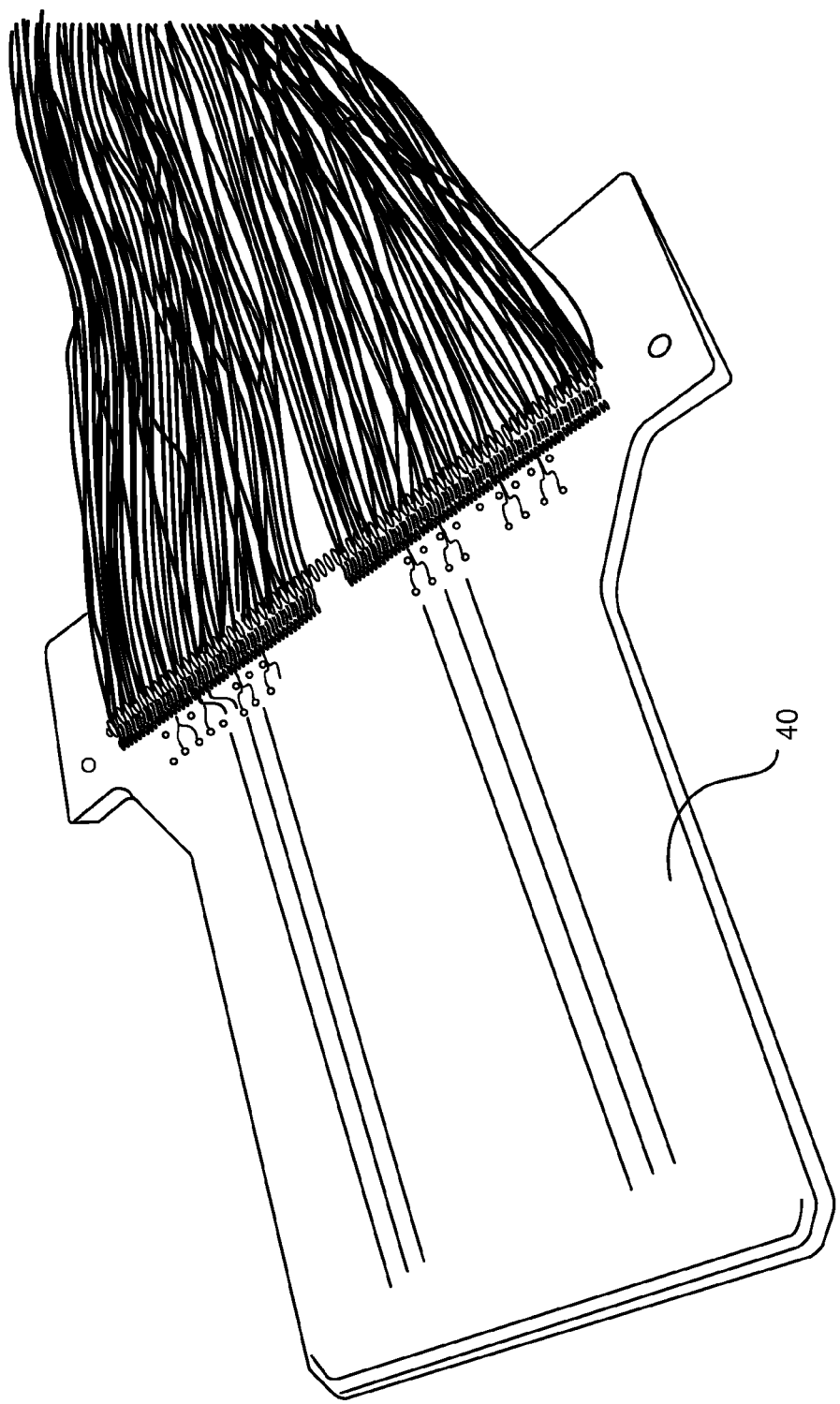
FIG. 9 is a perspective view of an example paddle board.

As noted above, the paddle boards also serve as the launch point for coaxial cables or other cable or non-cable connections to the customer TIU. In some implementations, each paddle board is constructed using relatively low-cost hot bar solder mass termination assembly techniques. In implementations that use coaxial cables on a paddle board, in order to fit all coaxial cables into the space available, different sized and/or types of coaxial cables may be used, depending on whether the cable is carrying high-speed signal or power. An example of a paddle board 40 having cables attached thereto is shown in FIG. 9.

Another feature of the ZIF interface described herein is the actuator assembly, an example 42 of which is shown in FIGS. 10A and 10B. The actuator assembly is shown from the tester side (FIG. 10A) and from the customer side (FIG. 10B). Example assembly 42 is configured to provide the following functionality. For example, assembly 42 may provide appropriate pre-alignment between a paddle board and corresponding SCA interposer. Assembly 42 also may provide the clamping force, as described below, to compress the H-pins in the SCA interposer to ensure electrical contact, via the H-pins, between contacts on the PE board and contacts on the paddle board (thereby creating an electrical pathway between the PE board and the paddle board via the SCA interposer). Assembly 42 also may provide an electrical disconnect mechanism.

Figure 16:
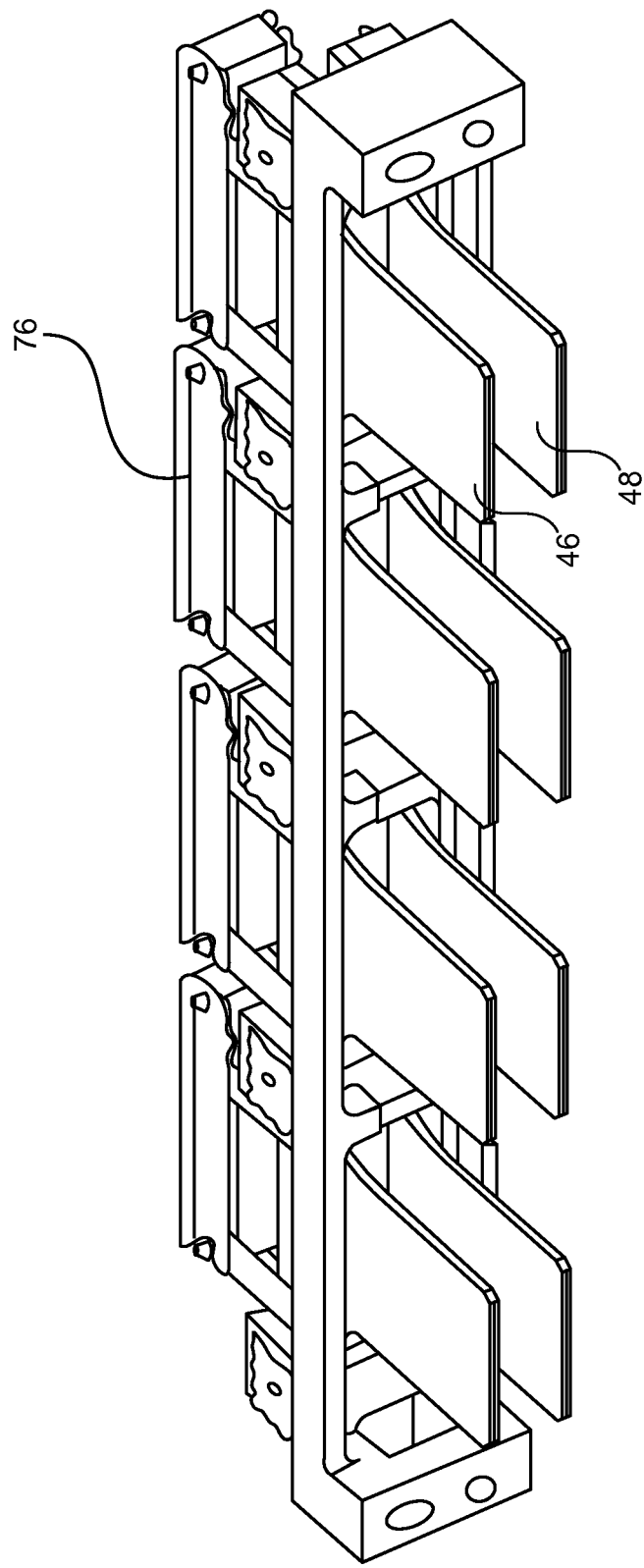
FIG. 16 is a perspective view of an example paddle board assembly from the perspective of a test instrument.

In some examples, the example ZIF mechanism actuator assembly 42 is incorporated into a field replaceable unit (FRU) that can be installed on a per-test-slot basis. ZIF actuator assemblies can thus be installed in the field, if required. These features may reduce zero-pin mechanical costs of the test head since, often, customers do not order test systems that are fully populated with instruments. However, a customer still has the flexibility to install additional ZIF actuators in the field should an upgrade be needed. Features of ZIF mechanism actuator assembly 42 also include alignment features. In this context, alignment features align a paddle board inserted into an FRU slot 44 to an SCA interposer. As shown in FIG. 10A, an example FRU may include multiple insertion slots. Furthermore, in the examples described herein, paddle boards are aligned vertically so as to mate to SCA interposers above and below a PE board. This is shown in FIG. 16, which depicts paddle boards 46 and 48 for insertion into an FRU slot.

Figure 11A:
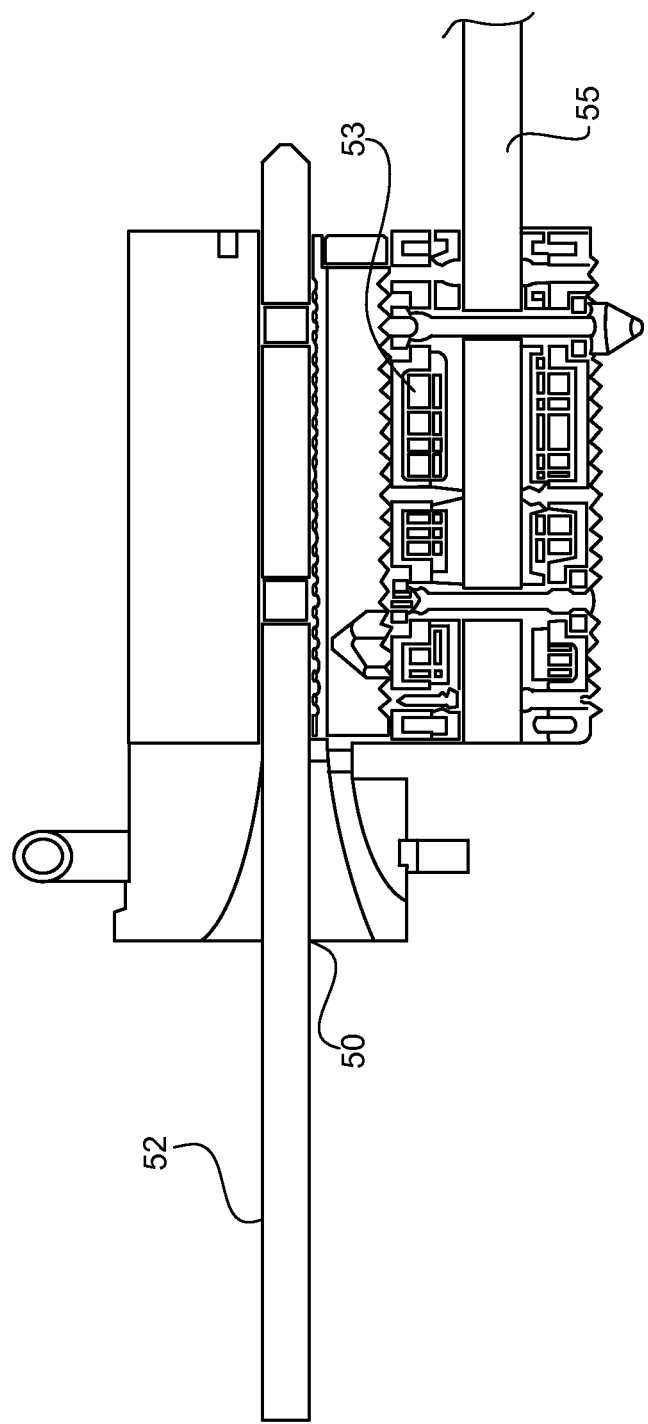
FIG. 11A is a side view of an example paddle board and coarse alignment feature for aligning the paddle board in a slot.
Figure 11B:
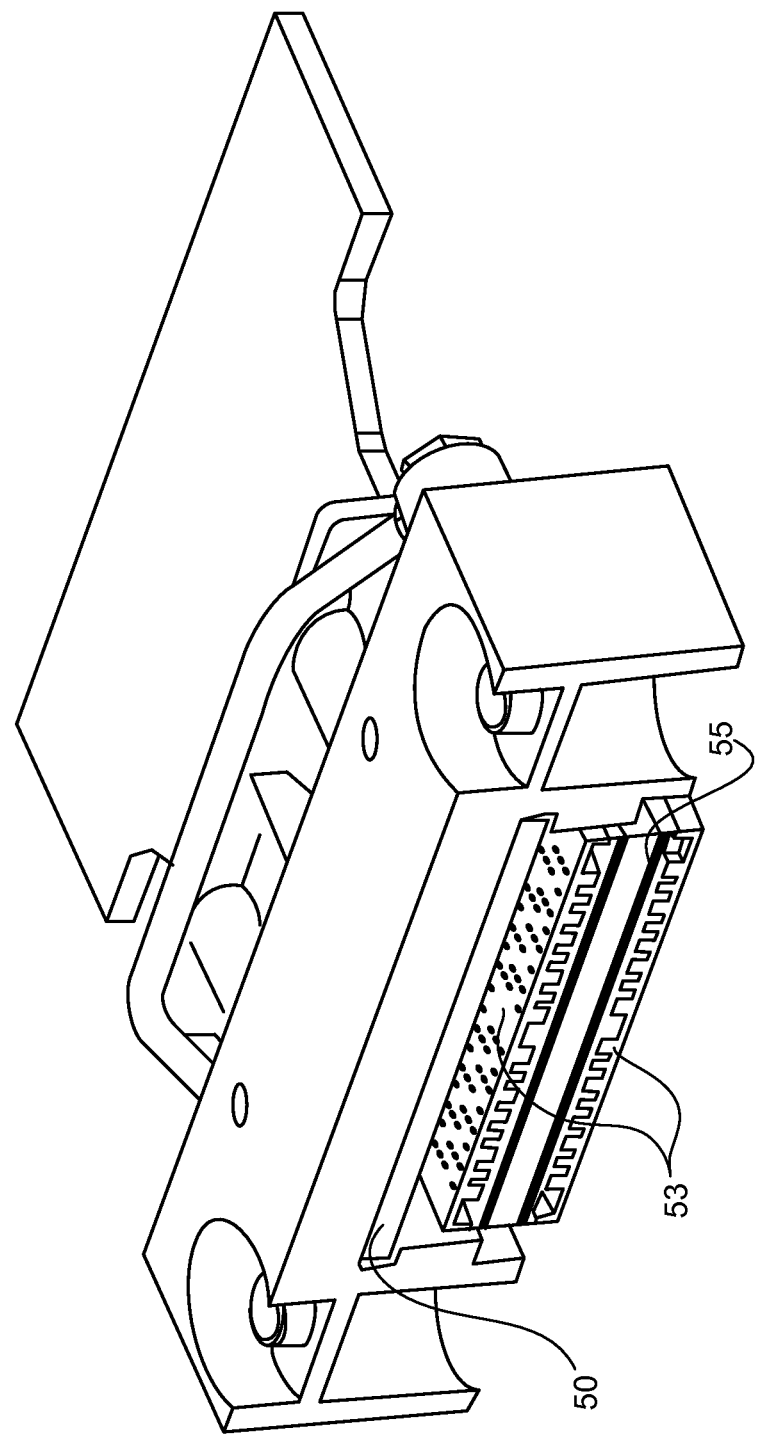
FIG. 11B is a perspective view of a slot structure.
Figure 12:
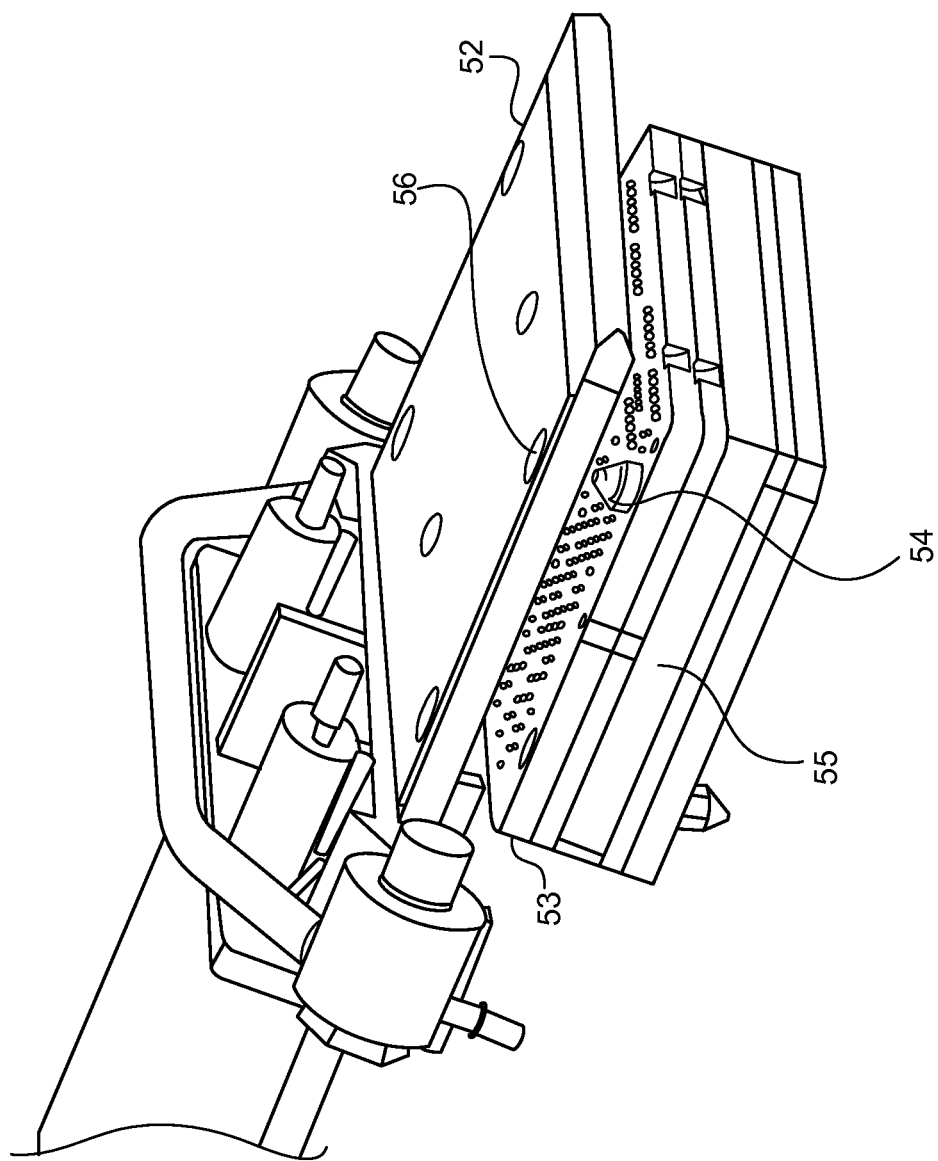
FIG. 12 is a perspective view of an example ZIF connection and fine alignment features, in this example pins, contained on an interposer.

An example alignment feature is configured to provide coarse alignment of the SCA interposer to paddle boards on the TIU as the TIU is connected to the tester. In some example implementations, there are eight injection-molded TIU alignment guides per actuator assembly; however, any appropriate number of alignment guides may be used. Once initial coarse alignment is achieved such that the TIU can be installed, a second level of coarse alignment is provided by the ZIF actuator assembly to ensure that each paddle board is contained in a slot that is within the alignment range of the SCA interposer actuator alignment pins. FIGS. 11A and 11B show example coarse alignment features 50, namely a slot guide for receiving a corresponding paddle board. In this regard, FIG. 11A shows a paddle 52 in a slot containing an interposer 53 and a PE board 55. Final alignment of paddle board 52 to an SCA interposer may be achieved using alignment pins 54 on the SCA interposer (FIG. 12). That is, the alignment pins mate to corresponding holes 56 on the paddle board. Any appropriate number of alignment pins and holes may be used. In some examples, these pins may be custom designed to have a large float capture range that is sufficient to capture the board once it is located.

Another function of the example ZIF actuator assembly is to provide a clamping force to force the paddle boards into contact with corresponding SCA interposers, thereby creating electrical pathways between the top and bottom of the PE board and corresponding paddle boards via the SCA interposers (see, e.g., FIG. 7). In some examples, the nominal compression force required by the SCA interposer pre-defined. Therefore, in these examples, the ZIF actuator supplies more force than this to overcome friction, cable forces, and other losses.

In an example ZIF, the interface mechanism need not be disturbed by power or air pressure loss. Therefore, in some examples, the clamping forces may be generated using actuator(s). In some implementations, the actuators may include springs, pneumatics (e.g., pistons), cams and/or screws. However, the interface described herein is not limited to user with these mechanisms. Rather, any appropriate type of actuator may be used including, but not limited to, actuators that include motors, piezoelectric materials, electromagnets, and so forth. In the example implementations described herein, pneumatics are used.

Figure 13:
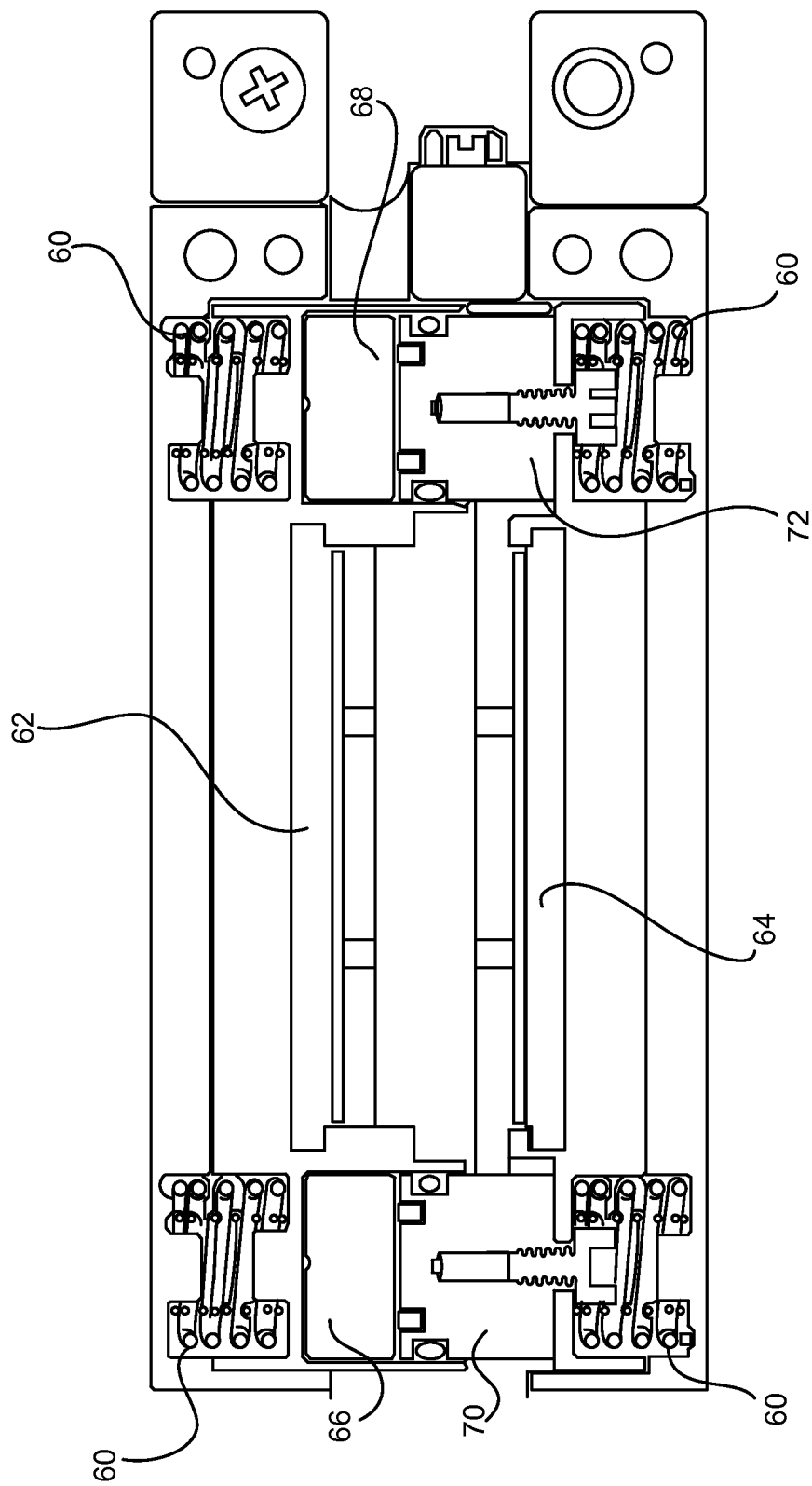
FIG. 13 is a front cross-sectional view of an open example ZIF connection containing actuators, in this example pistons and springs, for controlling connection of paddle boards to interposers.
Figure 14:
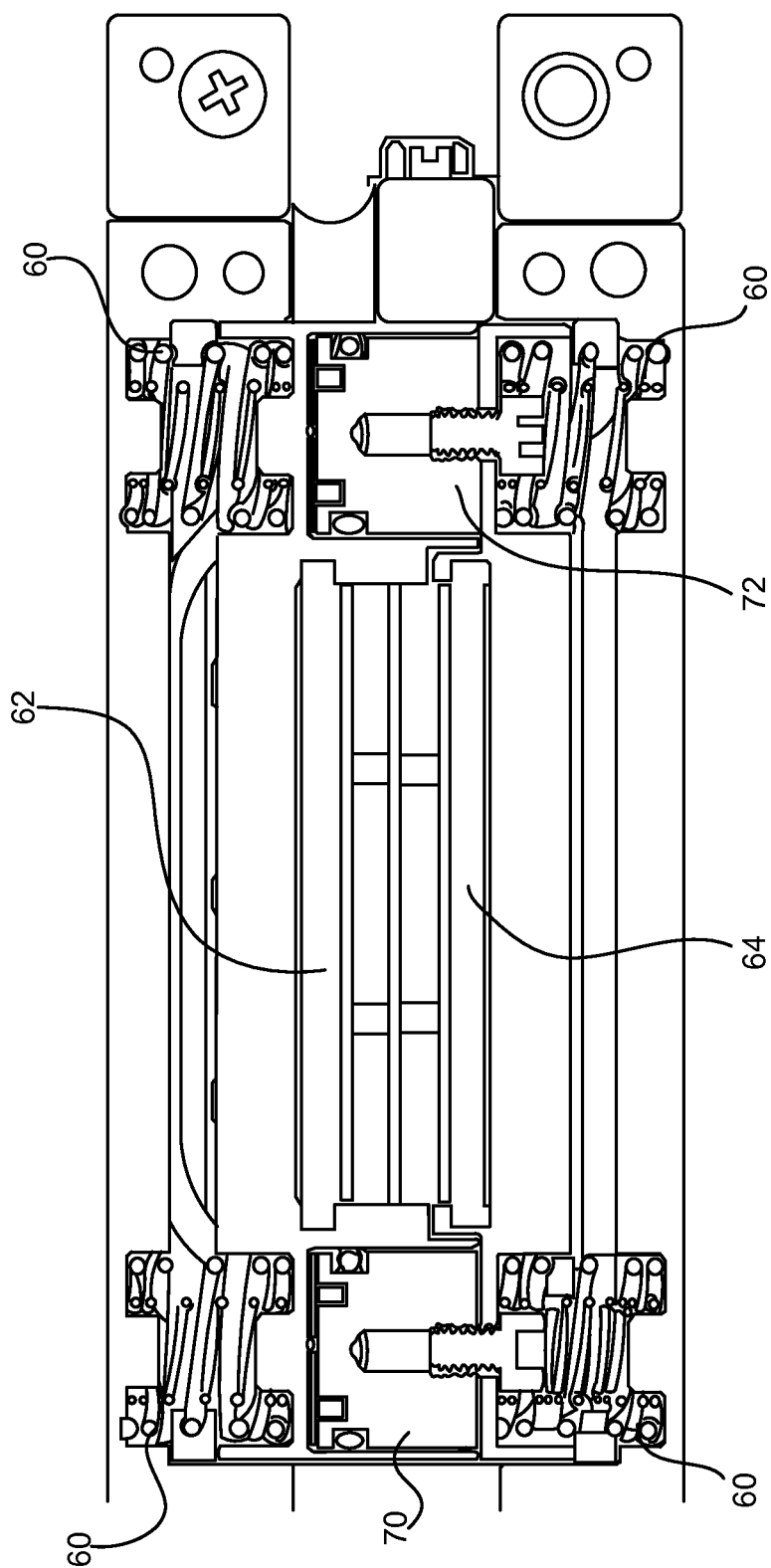
FIG. 14 is a front cross-sectional view of a closed example ZIF connection containing actuators, in this example pistons and springs, for controlling connection of paddle boards to interposers.

FIGS. 13 and 14 show side views of a ZIF connection that uses pneumatics to control pistons for use in opening and closing the connection. In the example of FIGS. 13 and 14, springs 60 are biased so that, when not compressed, the springs push against corresponding paddle boards 62, 64 to cause each paddle board to contact an SCA interposer. In this example, pneumatics (not shown) cause pistons 66, 68 to move from the closed position (FIG. 14), in which the springs are not compressed, to the open position (FIG. 13), in which the springs are compressed to thereby open the connection and mechanically, and therefore electrically, disconnect the paddle boards and corresponding SCA interposer.

In order to provide additional clamping force in a closed position, a vacuum may be pulled on an exhaust of each piston. The vacuum may generated by a venturitype vacuum generator (not shown) and, in some cases, may only be used during movement of the ZIF in order to help overcome friction in the moving parts. In this context, movement of the ZIF may include opening or closing the connection by moving the paddle boards.

When a ZIF interface is opened to perform a service operation (e.g., to change an instrument or TIU), in the above example, this may be accomplished by pressurizing the piston chambers 70, 72. In some examples, due to relatively small piston diameters, approximately 120 psi air pressure is used to generate the forces required to fully compress the springs and cause the ZIF interface contact to break (thereby breaking electrical pathway(s) between the PE board and paddle board(s), although other values may be used other implementations.

In some examples, because each paddle board is captured in a coarse float range, when piston chambers 70, 72 of FIGS. 13 and 14 are pressurized, the paddle boards are moved away from the H-pin contacts in order to achieve an electrical and mechanical disconnect (FIG. 13). The mechanical disconnect allows the TIU or instruments to be removed or installed without little or no damage to the TIU or instruments. The electrical disconnect enables running of tester diagnostics (as the customer application fixturing should be electrically isolated from the tester during this operation).

Figure 15:
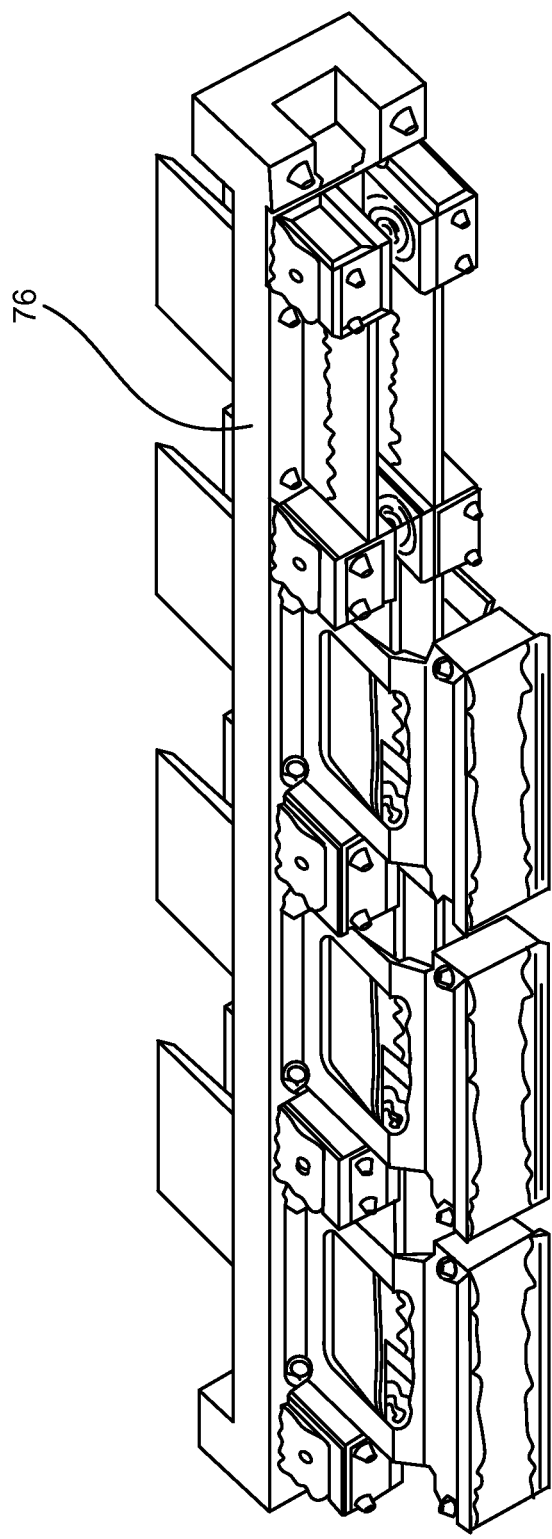
FIG. 15 is a perspective view of an example paddle board assembly from the perspective of a device under test.

Another component of the ZIF interface is the removable customer application fixturing, which is shown in FIGS. 15 and 16. The TIU SCA interposer paddle assembly 76 is the component that is used to bring the interface signals into this fixturing. This subassembly is intended to be used on a variety of different types of customer fixturing. In this regard, FIG. 15 shows the assembly from the tester side (e.g., the interface to the tester) and FIG. 16 shows the assembly from the DUT side (e.g., the interface to a DUT).

Assembly 76 has several functional features. For example, in some cases, assembly 76 provides a mechanism to place the paddle boards in a known position when the TIU is installed on the tester. Assembly 76 also allows the paddle boards to be articulated by the ZIF.

Figure 17:
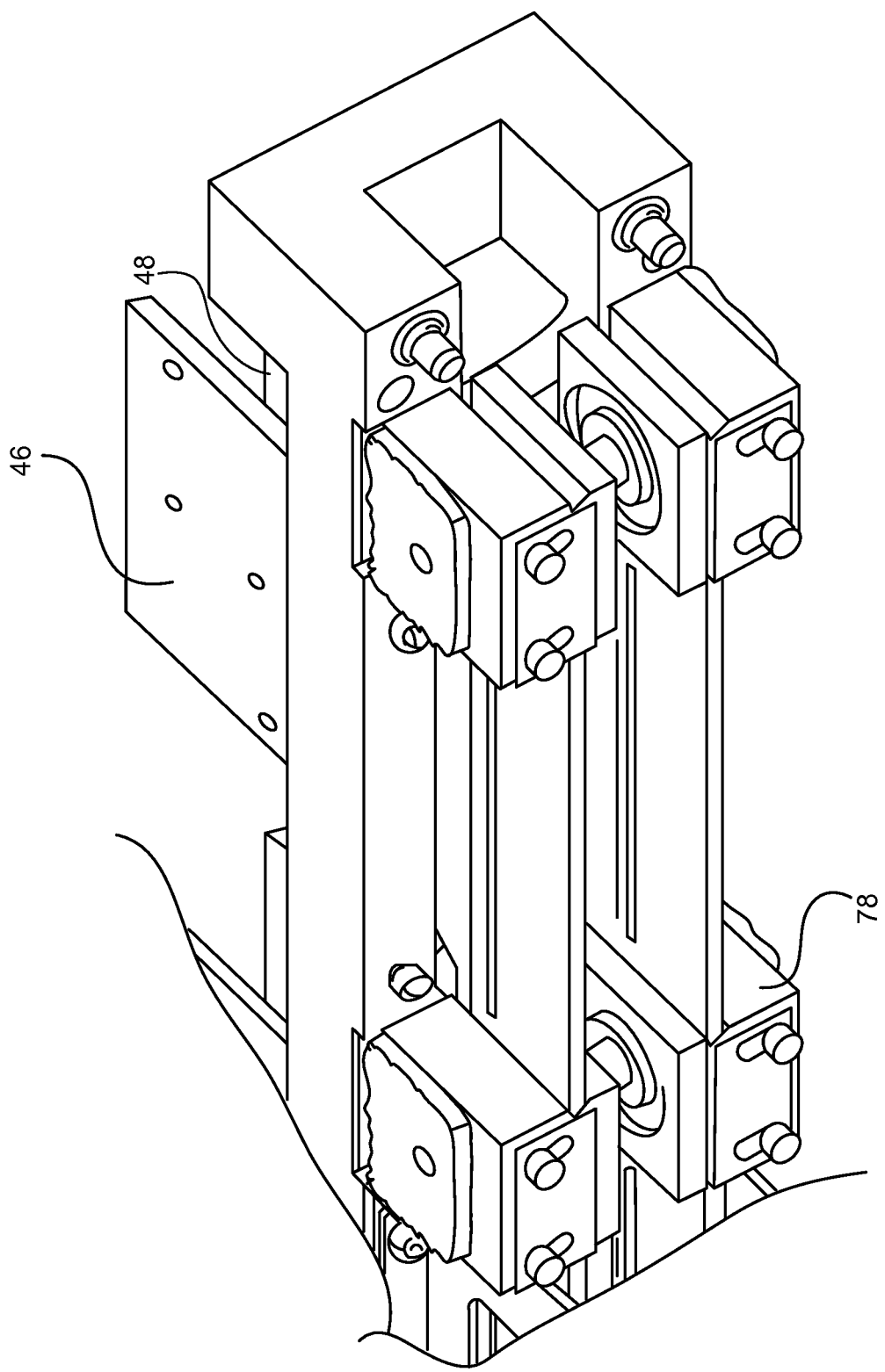
FIG. 17 is a perspective view of a portion of the example paddle board assembly, which shows paddle board carrier blocks.

As noted, the TIU SCA interposer paddle assembly 76 is configured to place the paddle boards in a known location. In some implementations, this may be accomplished by holding the paddle boards in blocks, such as acetal carrier blocks, that are part of assembly 76 and that provide a limited range of paddle float. The carrier blocks may be spring loaded in order to put the paddle boards in a known position when not engaged with the ZIF actuator to ensure that the paddle boards will be in a pre-determined position before installing the TIU on the tester. These carrier blocks 78 are shown in relation to example paddle boards 46, 48 in FIG. 17.

In some implementations, the paddle carrier blocks may be located on a shaft and are able to slide freely on the shaft. This allows the SCA interposer paddles to be articulated once they are installed into the ZIF actuator.

The control features described herein (e.g., control of the test head, control of the pneumatics, etc.) can be implemented, at least in part, via a computer program product, e.g., a computer program tangibly embodied in one or more information carriers, e.g., in one or more tangible, non-transitory machine-readable storage media, for execution by, or to control the operation of, data processing apparatus, e.g., one or more programmable processor, a computer, or multiple computers A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the control features can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Elements of different implementations described herein may be combined to form other implementations not specifically set forth above. Other implementations not specifically described herein are also within the scope of the following claims.

What is claimed is:

1. A test system comprising:
   a pin electronics (PE) board for exchanging signals with a device under test (DUT), the pin electronics board comprising first electrical contacts;
   an interposer between the pin electronics board and a paddle board, the paddle board comprising second electrical contacts, the interposer comprising electrical connectors for use in establishing electrical pathways between the first electrical contacts and the second electrical contacts; and
   an actuator configured to force the paddle board and the interposer to make contact so as to cause the electrical connectors to contact the second electrical contacts and thereby establish the electrical pathways.

2. The test system of claim 1, wherein the interposer is a first interposer, the paddle board is a first paddle board, the first electrical contacts are on a first side of the pin electronics board, the electrical connectors are first electrical connectors, and the pin electronics board comprises third contacts on a second side of the pin electronics board; and
   wherein the test system further comprises:
      a second interposer between the second side of the pin electronics board and a second paddle board, the second paddle board comprising fourth electrical contacts, the second interposer comprising second electrical connectors for use in establishing second electrical pathways between the third electrical contacts and the fourth electrical contacts;
      wherein the actuator is configured also to cause the second paddle board and the second interposer to make contact so as to cause the second electrical connectors to contact the fourth electrical contacts and thereby establish the second electrical pathways.

3. The test system of claim 1, further comprising one or more springs biased to cause connection of the paddle board and the interposer absent force applied by the actuator.

4. The test system of claim 3, wherein the actuator comprises a pneumatic system comprising one or more pistons that are controllable to compress one or more corresponding springs.

5. The test system of claim 1, further comprising:
   a field replaceable unit (FRU) comprising the actuator, wherein the FRU is installed in one of a plurality of slots of the PE board.

6. The test system of claim 5, further comprising alignment features comprising coarse alignment features comprising alignment guides; and
   wherein the interposer comprises fine alignment features, the fine alignment features comprising pins that corresponds to holes in the paddle board.

7. The test system of claim 5, wherein the FRU comprises multiple insertion slots, each of the multiple insertion slots accommodating two paddle boards, the two paddle boards being vertically arranged with the pin electronics board therebetween.

8. The test system of claim 7, wherein each of the multiple insertion slots is configured to receive two paddle boards using substantially zero insertion force.

9. The test system of claim 1, wherein the actuator comprises a screw or a cam and wherein the electrical connectors are pogo pins.

10. The test system of claim 1, wherein there are no cable connections between the pin electronics board and the paddle board.

11. The test system of claim 3, wherein the actuator comprises at least one of a motor, a piezoelectric material, an electromagnet, or pneumatics.

12. A test system comprising:
a field replaceable unit (FRU) comprising multiple insertion slots, each of the multiple insertion slots for accommodating a pair of paddle boards, each of the paddle boards being configured with electrical pathways to route signals between the test system and one or more devices under test (DUTs);
wherein at least one insertion slot of the multiple insertion slots comprises:
a pin electronics (PE) board for exchanging signals with a DUT, the pin electronics board comprising first electrical contacts on a first side thereof and second electrical contacts on a second side thereof;
a first interposer between the first side of the pin electronics board and a first paddle board of the pair of paddle boards, the first paddle board comprising third electrical contacts, the first interposer comprising first electrical connectors for use in establishing first electrical pathways between the first electrical contacts and the third electrical contacts;
a second interposer between the second side of the pin electronics board and a second paddle board of the pair of paddle boards, the second paddle board comprising fourth electrical contacts, the second interposer comprising second electrical connectors for use in establishing second electrical pathways between the second electrical contacts and the fourth electrical contacts; and
one or more actuators configured to apply force to the first and second paddle boards to so as to cause the first and second electrical connectors to contact the third and fourth electrical contacts, respectively, and thereby establish the first and second electrical pathways.

13. The test system of claim 12, wherein each of the multiple insertion slots comprises a pin electronics board, a first interposer, a second interposer, and one or more actuators.

14. The test system of claim 12, wherein the at least one insertion slot comprises one or more springs biased to inhibit connection of the first paddle board to the first interposer and the second paddle board to the second interposer absent force applied by the actuator.

15. The test system of claim 14, wherein the actuator comprises a pneumatic system comprising one or more pistons that are controllable to compress one or more corresponding springs.

16. The test system of claim 12, wherein the at least one insertion slot comprises alignment features for aligning each paddle board within the at least one insertion slot.

17. The test system of claim 16, wherein the alignment features comprise coarse alignment features comprising alignment guides; and
wherein each of the first interposer and the second interposer comprises fine alignment features, the fine alignment features comprising pins that corresponds to holes in a corresponding paddle board.

18. The test system of claim 12, wherein, on each interposer, each signal contact is associated with two ground pins to form a ground-signal-ground (GSG) triplet.

19. The test system of claim 12, wherein the at least one insertion slot is configured to receive two paddle boards using substantially zero insertion force.

20. The test system of claim 12, wherein the actuator comprises a screw or a cam and wherein the electrical connectors are pogo pins.

21. The test system of claim 12, wherein there are no cable connections between the pin electronics board and either the first paddle board or the second paddle board.

* * * * *